(12) United States Patent
Zhang et al.

(10) Patent No.: US 8,603,916 B2
(45) Date of Patent: Dec. 10, 2013

(54) CMP TECHNIQUES FOR OVERLAPPING LAYER REMOVAL

(75) Inventors: John H. Zhang, Fishkill, NY (US); Paul Ferreira, Barraux (FR)

(73) Assignee: STMicroelectronics, Inc., Coppell, TX (US)

( * ) Notice: Subject to any disclaimer, the term of this patent is extended or adjusted under 35 U.S.C. 154(b) by 599 days.

(21) Appl. No.: 12/649,491

(22) Filed: Dec. 30, 2009

(65) Prior Publication Data

US 2011/0156152 A1  Jun. 30, 2011

(51) Int. Cl.
*H01L 21/302* (2006.01)

(52) U.S. Cl.
USPC ............... 438/692; 257/E21.23; 257/E27.062

(58) Field of Classification Search
USPC .............. 257/369, E21.23, E27.062; 438/692
See application file for complete search history.

(56) References Cited

U.S. PATENT DOCUMENTS

| 6,864,163 B1 * | 3/2005 | Yu et al. ........................ 438/585 |
| 2006/0228836 A1 * | 10/2006 | Yang et al. ..................... 438/149 |
| 2008/0150145 A1 * | 6/2008 | King et al. ..................... 257/762 |
| 2008/0157216 A1 * | 7/2008 | Kim et al. ...................... 257/374 |
| 2008/0251851 A1 * | 10/2008 | Pan et al. ....................... 257/369 |
| 2009/0166714 A1 * | 7/2009 | Sung et al. ..................... 257/324 |

* cited by examiner

*Primary Examiner* — James Mitchell
*Assistant Examiner* — Colleen E Snow
(74) *Attorney, Agent, or Firm* — Wolf, Greenfield & Sacks, P.C.

(57) ABSTRACT

Chemical-Mechanical Polishing can be used to planarize a semiconductor wafer having a patterned overlapping layer. Isotropic etching can remove a portion of the patterned overlapping layer to produce tapered sidewalls of reduced height. A portion of the overlapping layer can be removed using CMP. The overlapping layer can have a higher polishing rate than the underlying layer so that the underlying layer remains substantially intact after removing the overlying layer.

37 Claims, 7 Drawing Sheets

CMP TECHNIQUES FOR OVERLAPPING LAYER REMOVAL

BACKGROUND OF THE INVENTION

1. Field of Invention

The techniques described herein relate generally to Chemical Mechanical Polishing (CMP), and more particularly to techniques for planarizing a semiconductor wafer having overlapping layers.

2. Discussion of the Related Art

Chemical Mechanical Polishing (CMP) is a technique commonly used for polishing semiconductor wafers to obtain a substantially planar surface. Achieving a planar surface can be important to achieve uniformity and high yield, and obtain suitable depth of focus for subsequent photolithographic alignment steps. Conventional CMP techniques use a polishing pad that polishes the semiconductor wafer using an abrasive slurry and chemical mixture.

SUMMARY OF THE INVENTION

Some embodiments relate to a method of forming an overlapping layer on a wafer and removing portions of the overlapping layer. For example, a first layer may be formed above a substrate, and a second layer may be formed at least partially on the first layer. The second layer may be isotropically etched to remove a region of the second layer over the first layer. The wafer may be polished to remove at least a portion of the second layer remaining after isotropically etching the second layer.

Some embodiments relate to a method of forming an overlapping layer on a wafer and removing portions of the overlapping layer. For example, a first layer may be formed above a substrate, and a second layer may be formed at least partially on the first layer. The second layer may be etched to remove a region of the second layer over the first layer. The wafer may be polished to remove at least a portion of the second layer remaining after etching the second layer. The polishing rate of the second layer may be greater than a polishing rate of the first layer.

Some embodiments relate to a semiconductor chip that includes a first layer formed over a region of a substrate comprising a PMOS transistor. The top of the first layer has a substantially planar surface. The semiconductor chip also includes a second layer formed over a region of a substrate comprising an NMOS transistor. The top of the second layer has a substantially planar surface that is substantially co-planar with a top of the first layer. The first layer may be formed of a material having a lower polishing rate than that of the second layer.

This summary is presented by way of illustration and is not intended to be limiting.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein.

BRIEF DESCRIPTION OF DRAWINGS

In the drawings, each identical or nearly identical component that is illustrated in various figures is represented by a like reference character. For purposes of clarity, not every component may be labeled in every drawing. The drawings are not necessarily drawn to scale, with emphasis instead being placed on illustrating various aspects of the invention. In the drawings.

DETAILED DESCRIPTION

Applicants have recognized and appreciated problems caused by the protruding step-height of a patterned overlapping layer on a semiconductor wafer, and the surface irregularities that can be caused by using CMP to remove the overlapping layer. Examples of these problems will be discussed with reference to FIGS. 1-3.

Figure 1:
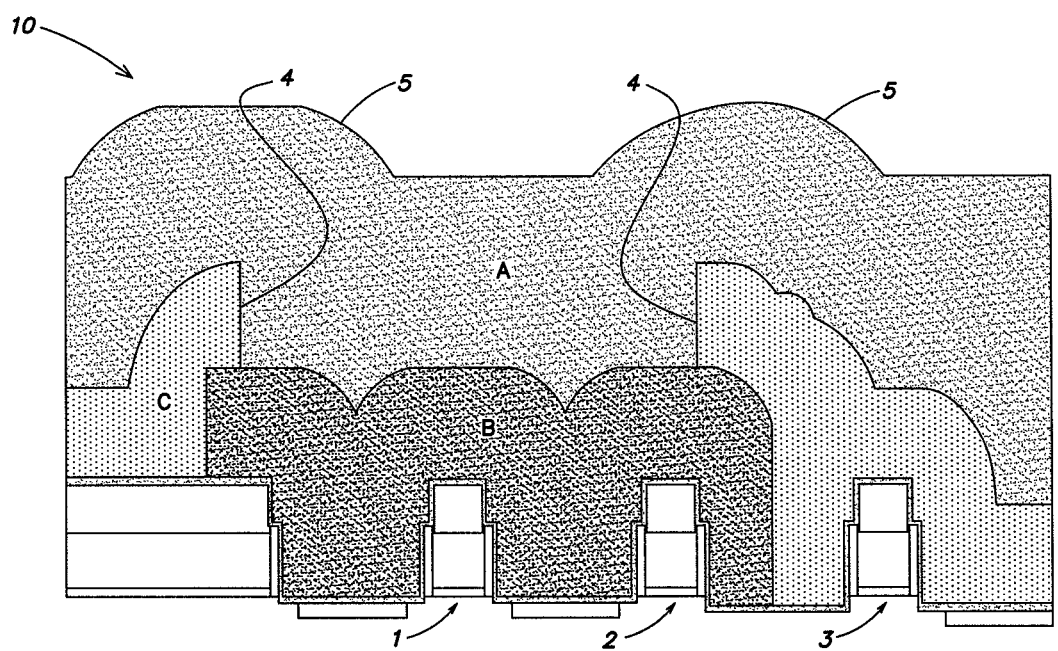
FIG. 1 shows a cross section of a semiconductor wafer having an anisotropically patterned overlapping layer.

FIG. 1 shows a cross section of a semiconductor wafer 10 that may be polished using CMP to obtain a substantially planar surface. As shown in FIG. 1, semiconductor wafer 10 includes NMOS transistors 1 and 2, and a PMOS transistor 3. A tensilely-strained silicon nitride layer "B" is formed on the NMOS transistors 1 and 2 as a stress-liner to increase the electron mobility in their channel regions. A compressively-strained silicon nitride layer "C" is formed on the PMOS transistor 3 as a stress-liner to increase the hole mobility in its channel region. Silicon nitride layer C is formed partially on top of silicon nitride layer B, and then silicon nitride layer C is patterned to remove a portion of silicon nitride layer C above silicon nitride layer B. As shown in FIG. 1, a region of silicon nitride layer C above the PMOS transistors 1 and 2 is removed by anisotropic etching. The use of an anisotropic etchant results in substantially vertical stepped sidewalls 4 of silicon nitride layer C on top of silicon nitride layer B, having a large step height. A sacrificial layer "A" of silicon dioxide is then formed on top of silicon nitride layers B and C. The stepped sidewalls 4 and remaining portions of silicon nitride layer C on silicon nitride layer B create bumps 5 on the surface of silicon dioxide layer A.

Figure 2:
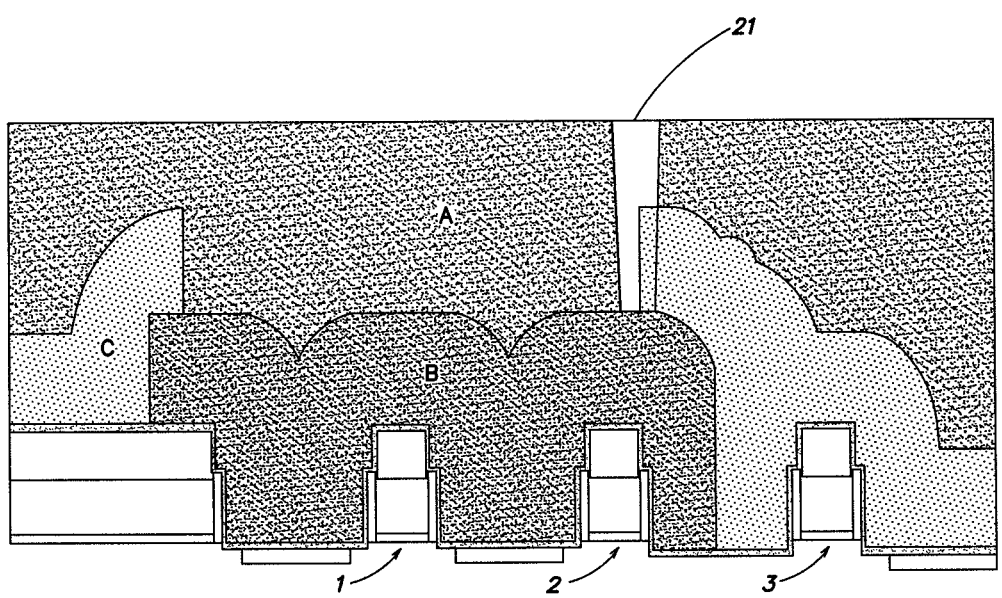
FIG. 2 shows a cross section of a polished wafer and the location of a gate contact opening.

According to one conventional technique shown in FIG. 2, silicon dioxide layer A is planarized using CMP to remove a portion of silicon dioxide layer A. FIG. 2 shows that planarizing silicon dioxide layer A removes the bumps 5 created by the stepped sidewalls 4. One problem with the CMP technique shown in FIG. 2 is the difficulty of forming an opening 21 to make contact to the gate of NMOS transistor 2. As shown in FIG. 2, the opening 21 passes though regions of both silicon dioxide layer A and silicon nitride layer C. Forming the opening 21 thorough both layers A and C may not be successful due to microloading effects during reactive ion etching to form opening 21, due to the presence of silicon nitride layer C in the etch path. As a result, the opening to the gate of transistor 2 may not be completely formed. If the formation of opening 21 is unsuccessful, the desired contact to the gate of transistor 2 cannot be formed, causing the integrated circuit to malfunction. This problem may be more difficult to overcome as transistor sizes continue to shrink and the gate contact area is reduced. More generally, the step-heights caused by overlap of different films may appear in various levels of a wafer, particularly as commercial integrated circuit fabrication progresses to the 32 nm node and beyond.

Figure 3:
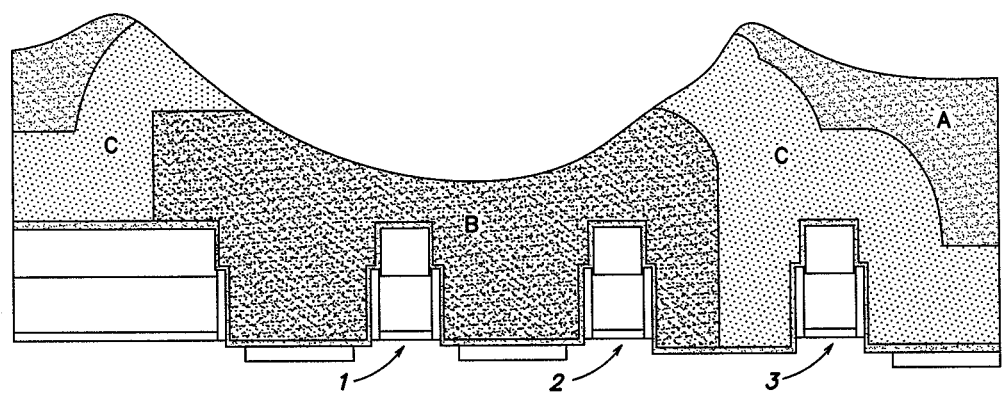
FIG. 3 shows a wafer polished in a non-uniform manner.

Another conventional technique is to polish the wafer to a greater degree during CMP such that the stepped sidewalls 4 and remaining portions of silicon nitride layer C on silicon nitride layer B are removed. However, this technique may result in severe wafer non-uniformity during CMP. For example, when the polishing rate of silicon nitride layer B is greater than the polishing rate of silicon nitride layer C, a significant portion of silicon nitride layer B can be removed unintentionally during CMP, causing severe non-uniformity, as shown in FIG. 3. In the extreme case where the polishing rate of silicon nitride layer B is much larger than that of silicon nitride layer C, CMP may even remove the entire silicon nitride layer B.

Various inventive techniques described herein can provide improved uniformity by reducing or eliminating overlapping layer step-heights. In some embodiments, an overlapping layer can be isotropically etched to form an opening with reduced sidewall height. Reducing the sidewall height prior to CMP can lower the burden of planarizing the wafer during CMP.

In some of the inventive techniques described herein, a CMP process may be used to polish an overlapping layer to reduce or eliminate its sidewall step-height. The overlapping layer may be selected to have a higher CMP polish rate than the layer upon which it is formed. In some embodiments, an overlapping layer B is formed partially on top of layer C. A sacrificial layer A may be formed on layers B and C that has a CMP polishing rate of greater than or equal to the CMP polishing rate of the overlapping layer B. The rates of polishing of the layers A, B and C may satisfy the relationship $R_A \geq R_B > R_C$, where $R_A$ is the polishing rate of layer A, $R_B$ is the polishing rate of layer B, and $R_C$ is the polishing rate of layer C. The wafer may be polished down to the underlying layer C using CMP by removing portions of overlapping layer B and sacrificial layer A.

Figure 4:
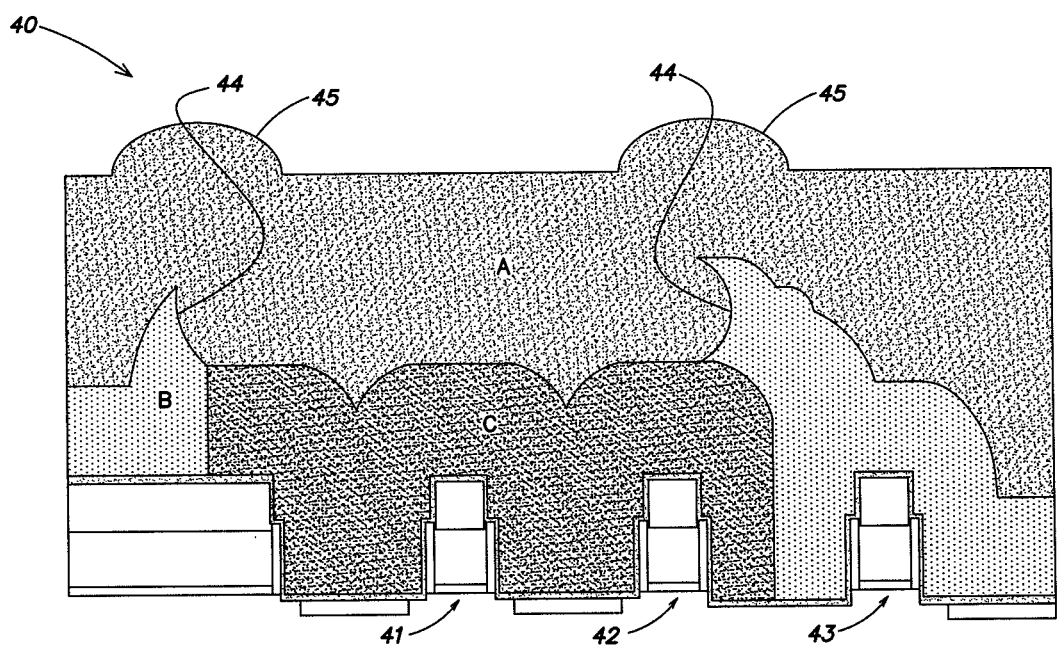
FIG. 4 shows an inventive technique for isotropically etching an overlapping layer to reduce its height.

FIG. 4 shows a cross section of a semiconductor wafer 40, in accordance with some embodiments. Semiconductor wafer 40 includes PMOS transistors 41 and 42, and an NMOS transistor 43. A compressively-strained silicon nitride layer "C" is formed on the PMOS transistors 41 and 42 to increase the hole mobility in their channel regions. A tensilely-strained silicon nitride layer "B" is formed on the NMOS transistor 43 to increase the electron mobility in its channel region. Silicon nitride layer B may be formed on top of silicon nitride layer C, and then silicon nitride layer B may be patterned to remove a portion of silicon nitride layer B above silicon nitride layer C.

As shown in FIG. 4, the overlapping portion of silicon nitride layer B may be isotropically etched to remove a portion of silicon nitride layer B and produce tapered sidewalls 44 having a reduced height. The sidewalls 44 can be lower and have a more gradual slope than a step-shaped sidewall 4 produced with anisotropic etching. The reduced sidewall height can reduce the burden of planarizing the wafer during subsequent CMP processing. After isotropically etching silicon nitride layer B, a sacrificial layer "A" of silicon dioxide may be formed on top of silicon nitride layers B and C, as shown in FIG. 4. The tapered sidewalls 44 in silicon nitride layer B may create bumps 45 on the surface of silicon dioxide layer A that are smaller than would be the case when silicon nitride layer B has vertical sidewalls.

The wafer 40 may then be polished using CMP to planarize its surface. A standard CMP process may be used to polish layer A, B and C, as known in the art, although a specialized or optimized process may be used in some circumstances. In some embodiments, the polishing rates of the layers A, B and C satisfy the relationship $R_A \geq R_B > R_C$, where $R_A$ is the polishing rate of layer A, $R_B$ is the polishing rate of layer B, and $R_C$ is the polishing rate of layer C. As used herein, the term "polishing rate" means the rate at which the height of a layer is reduced by removal of material in the polishing process.

In some embodiments, overlapping layer B may be formed to have a higher polishing rate than underlying layer C, which may allow removing the overlapping region of layer B without removing a substantial thickness of layer C. For example, layer C may be formed of compressively-strained silicon nitride and layer B may be formed of tensilely-strained silicon nitride, as the polishing rate of tensilely-strained silicon nitride may be greater than that of compressively-strained silicon nitride. As an example, the polishing rate of compressively-strained silicon nitride may be about 7.2 Å/s and the polishing rate of tensilely-strained silicon nitride may be about 10.6 Å/s in a standard CMP process. However, the invention is not limited to the use of silicon nitride for layers B and C, as any other suitable materials may be used with suitable polishing rates. The desired relative polishing rates may be achieved by using different materials instead of, or in conjunction with, layers of different strain. For example, layer B may be formed of a first material with a relatively high polishing rate and layer C may be formed of a different material with a relatively low polishing rate. Various techniques may be used to achieve the desired relative polishing rates of layers B and C. In some embodiments it may be preferable, though not necessary, that the polishing rate of layer B be much higher than the polishing rate of layer C (i.e., $R_b \gg R_c$) to improve the selectivity of removing the overlapping portion layer B while keeping layer C substantially intact. However, suitable results can be achieved when the polishing rate of layer B is only slightly or moderately higher than that of layer C.

In some embodiments, the polishing rate of sacrificial layer A may be greater than or approximately equal to the polishing rate of layer B. For example, layer A may be formed of silicon dioxide, and the polishing rate of silicon dioxide may be about 22 Å/s in a standard CMP process, which may be greater than that of tensilely-strained silicon nitride layer B. However, the invention is not limited to the use of silicon dioxide for layer A, as other suitable materials can be used. In some embodiments it may be preferable, though not necessary, that the polishing rate of layer A be approximately equal to that of layer B. However, suitable results can be achieved when the polishing rate of layer A is greater than that of layer B.

Figure 5:
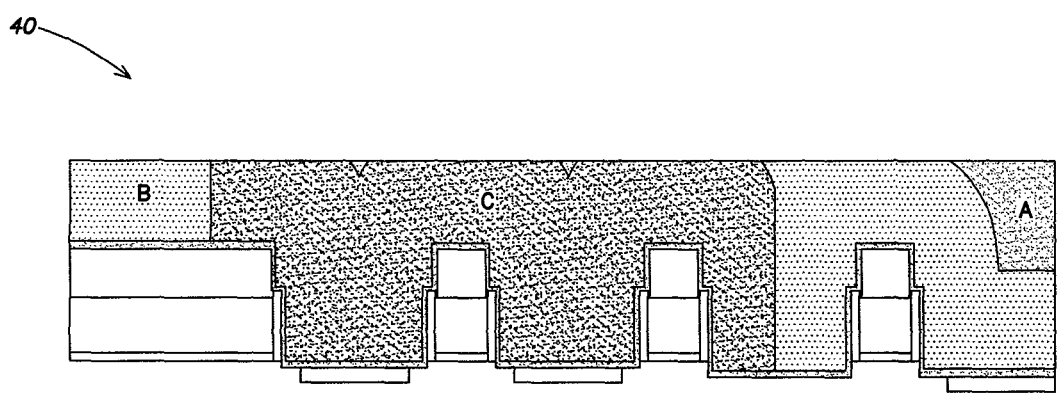
FIG. 5 shows a cross section of a highly-planarized wafer, according to some inventive embodiments.

FIG. 5 shows a cross section of wafer 40 after performing CMP according to a process in which the polishing rates of layers A, B and C satisfy the relationship $R_A \geq R_B > R_C$. As shown in FIG. 5, a substantial portion of sacrificial layer A may be removed and the overlapping portion of layer B on layer C may be removed. The polishing may be stopped upon reaching layer C. Due to the lower polishing rate of layer C, layer C may be substantially intact after the polishing step. As shown in FIG. 5, the top of layers A, B and C may be substantially co-planar with one another at the top of the polished wafer after the polishing step. The top of wafer 40 may be substantially planar, and subsequent material deposition and/or patterning may be performed on the highly-planarized surface.

Figure 6:
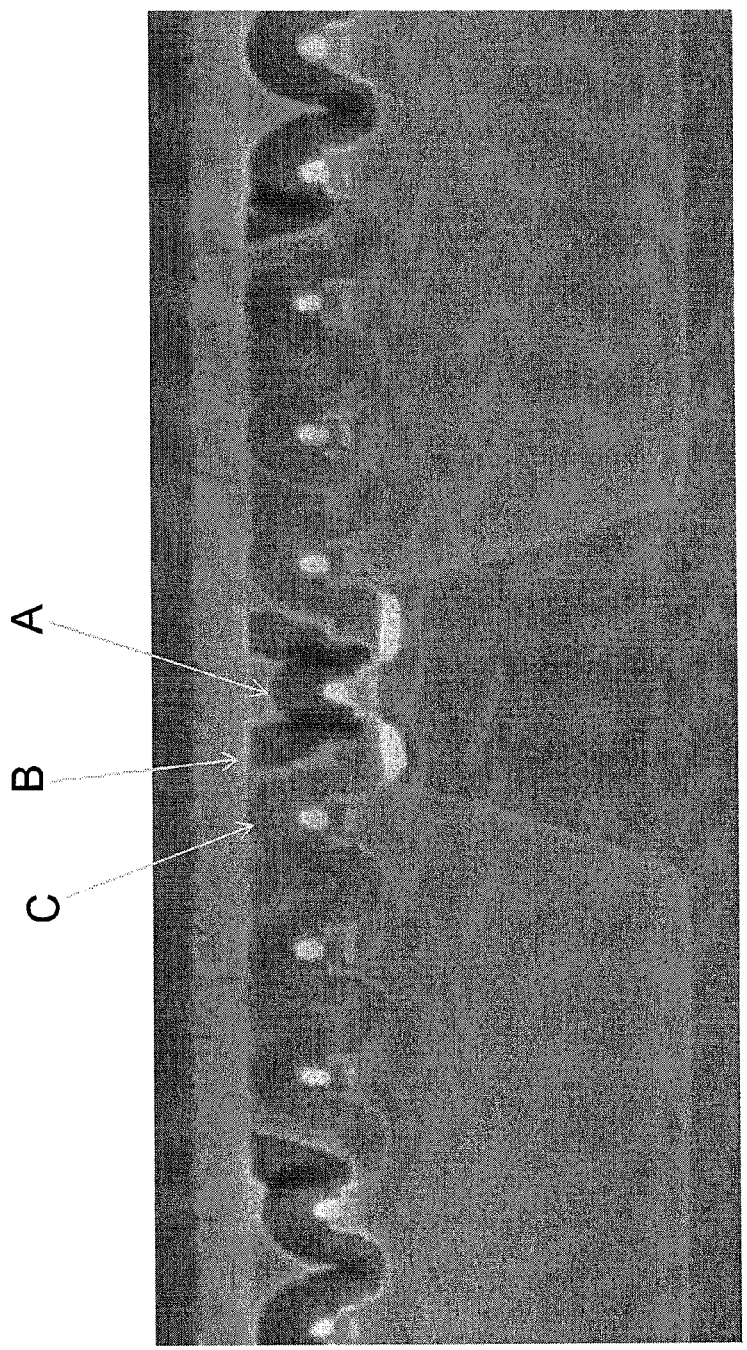
FIG. 6 shows an image of the cross section of a highly-planarized wafer.

FIG. 6 shows an image of a wafer that has been planarized according to the techniques discussed with respect to FIGS. 4 and 5. FIG. 6 shows that excellent planarization and uniformity can be achieved using these techniques.

Figure 7:
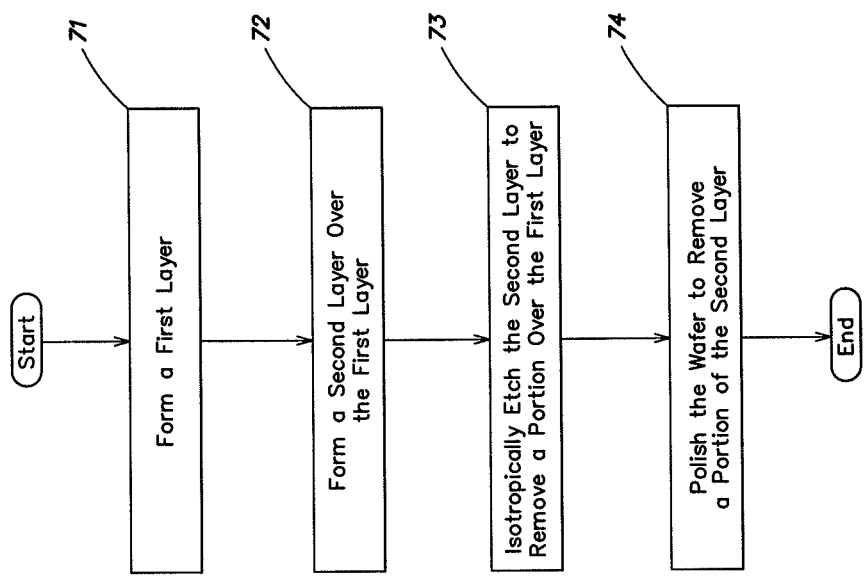
FIG. 7 shows a flowchart of a method of forming and removing portions of an overlapping layer, according to some embodiments.

FIG. 7 shows a flowchart of method of forming an overlapping layer on a wafer and removing portions of the overlapping layer, according to some embodiments. In step 71, a first layer may be formed on a substrate. For example, a compressively-strained silicon nitride layer C may be formed over a semiconductor substrate, as shown in FIG. 4. Then, a second layer may be formed over the first layer in step 72. For example, a tensilely-strained silicon nitride layer B may be formed with at least a portion overlapping the first layer. For example, a portion of the second layer may completely cover the surface of the wafer, including the first layer. Then, a portion of the second layer overlying the first layer may be optionally removed by isotropic etching in step 73, as shown in FIG. 4. The wafer may be polished in step 74 using CMP to remove the remaining portion of the second layer above the first layer, as shown in FIG. 5. The second layer may have a higher polish rate than the first layer so that CMP can be stopped after removing the overlying portion of the second layer.

This invention is not limited in its application to the details of construction and the arrangement of components set forth in the foregoing description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A method of forming an overlapping layer and removing portions of the overlapping layer, the method comprising:
   forming a first insulating layer above a substrate;
   forming a second insulating layer at least partially on the first insulating layer;
   isotropically etching the second insulating layer to remove a region of the second insulating layer over the first insulating layer; and
   polishing to remove at least a portion of the second insulating layer remaining on the first insulating layer after isotropically etching the second insulating layer,
   wherein the first insulating layer is compressively strained and the second insulating layer is tensilely-strained.

2. The method of claim 1, further comprising:
   forming a sacrificial layer over the first insulating layer and the second insulating layer, wherein polishing removes at least a portion of the sacrificial layer.

3. The method of claim 2, wherein the sacrificial layer comprises silicon dioxide.

4. The method of claim 2, wherein the polishing is performed to remove portions of the second insulating layer and the sacrificial layer above an uppermost portion of the first insulating layer.

5. The method of claim 4, wherein the polishing is performed such that a top of the first insulating layer, a top of the second insulating layer and a top of the sacrificial layer are substantially co-planar.

6. The method of claim 2, wherein the polishing is performed using chemical-mechanical polishing.

7. The method of claim 6, wherein a polishing rate of the second insulating layer is greater than a polishing rate of the first insulating layer.

8. The method of claim 6, wherein a polishing rate of the sacrificial layer is greater than or approximately equal to the polishing rate of the second insulating layer.

9. The method of claim 1, wherein the first insulating layer comprises silicon nitride and the second insulating layer comprises silicon nitride.

10. A method of forming an overlapping layer and removing portions of the overlapping layer, the method comprising:
    forming a first layer above a substrate;
    forming a second layer, at least a region of the second layer being on and in contact with the first layer;
    etching the second layer to remove a region of the second layer over the first layer; and
    polishing to remove at least a portion of the second layer remaining after etching the second layer, wherein a polishing rate of the second layer is greater than a polishing rate of the first layer.

11. The method of claim 10, further comprising:
    forming a sacrificial layer over the first layer and the second layer, wherein polishing removes at least a portion of the sacrificial layer,
    wherein a polishing rate of the sacrificial layer is greater than or approximately equal to the polishing rate of the second layer.

12. The method of claim 11, wherein the sacrificial layer comprises silicon dioxide.

13. The method of claim 11, wherein the polishing is performed to remove portions of the second layer and the sacrificial layer above an uppermost portion of the first layer.

14. The method of claim 13, wherein the polishing is performed such that a top of the first layer, a top of the second layer and a top of the sacrificial layer are substantially co-planar.

15. The method of claim 10, wherein the polishing is performed using chemical-mechanical polishing.

16. The method of claim 10, wherein the first layer is compressively strained and the second layer is tensilely-strained.

17. The method of claim 16, wherein the first insulating layer comprises silicon nitride and the second insulating layer comprises silicon nitride.

18. A semiconductor chip, comprising:
    a first layer formed over a region of a substrate comprising a PMOS transistor, wherein a top of the first layer has a substantially planar surface; and
    a second layer formed over a region of a substrate comprising an NMOS transistor, wherein a top of the second layer has a substantially planar surface that is substantially co-planar with a top of the first layer, wherein the first and second layers contact one another at a substantially planar surface of the semiconductor chip,
    wherein the first layer is formed of a material having a lower polishing rate than that of the second layer.

19. The semiconductor chip of claim 18, wherein the first layer is compressively strained and the second layer is tensilely-strained.

20. The semiconductor chip of claim 18, wherein the first layer comprises silicon nitride and the second layer comprises silicon nitride.

21. A method comprising:
   forming a first layer above a substrate;
   forming a second layer at least partially over the first layer;
   etching the second layer to remove a region of the second layer over the first layer; and
   after etching the second layer, polishing to remove at least a portion of the second layer remaining over the first layer, wherein a polishing rate of the second layer is greater than a polishing rate of the first layer.

22. The method of claim 21, further comprising:
   forming a sacrificial layer over the first layer and the second layer, wherein polishing removes at least a portion of the sacrificial layer,
   wherein a polishing rate of the sacrificial layer is greater than or approximately equal to the polishing rate of the second layer.

23. The method of claim 22, wherein the sacrificial layer comprises silicon dioxide.

24. The method of claim 22, wherein the polishing is performed to remove portions of the second layer and the sacrificial layer above an uppermost portion of the first layer.

25. The method of claim 24, wherein the polishing is performed such that a top of the first layer, a top of the second layer and a top of the sacrificial layer are substantially co-planar.

26. The method of claim 21, wherein the polishing is performed using chemical-mechanical polishing.

27. The method of claim 21, wherein the first layer is compressively strained and the second layer is tensilely-strained.

28. The method of claim 27, wherein the first insulating layer comprises silicon nitride and the second insulating layer comprises silicon nitride.

29. A method of forming an overlapping layer and removing portions of the overlapping layer, the method comprising:
   forming a first insulating layer above a substrate;
   forming a second insulating layer at least partially on the first insulating layer;
   isotropically etching the second insulating layer to remove a region of the second insulating layer over the first insulating layer;
   polishing to remove at least a portion of the second insulating layer remaining on the first insulating layer after isotropically etching the second insulating layer; and
   forming a sacrificial layer over the first insulating layer and the second insulating layer, wherein polishing removes at least a portion of the sacrificial layer,
   wherein the polishing is performed using chemical-mechanical polishing, and
   wherein a polishing rate of the sacrificial layer is greater than or approximately equal to the polishing rate of the second insulating layer.

30. The method of claim 29, wherein the sacrificial layer comprises silicon dioxide.

31. The method of claim 29, wherein the polishing is performed to remove portions of the second insulating layer and the sacrificial layer above an uppermost portion of the first insulating layer.

32. The method of claim 31, wherein the polishing is performed such that a top of the first insulating layer, a top of the second insulating layer and a top of the sacrificial layer are substantially co-planar.

33. The method of claim 29, wherein a polishing rate of the second insulating layer is greater than a polishing rate of the first insulating layer.

34. A method of forming an overlapping layer and removing portions of the overlapping layer, the method comprising:
   forming a first insulating layer above a substrate;
   forming a second insulating layer at least partially on the first insulating layer;
   isotropically etching the second insulating layer to remove a region of the second insulating layer over the first insulating layer;
   polishing to remove at least a portion of the second insulating layer remaining on the first insulating layer after isotropically etching the second insulating layer; and
   forming a sacrificial layer over the first insulating layer and the second insulating layer, wherein polishing removes at least a portion of the sacrificial layer,
   wherein the polishing is performed using chemical-mechanical polishing, and
   wherein a polishing rate of the second insulating layer is greater than a polishing rate of the first insulating layer.

35. The method of claim 34, wherein the sacrificial layer comprises silicon dioxide.

36. The method of claim 34, wherein the polishing is performed to remove portions of the second insulating layer and the sacrificial layer above an uppermost portion of the first insulating layer.

37. The method of claim 36, wherein the polishing is performed such that a top of the first insulating layer, a top of the second insulating layer and a top of the sacrificial layer are substantially co-planar.

* * * * *